Sept. 27, 1966 P. L. COUTURE 3,275,542

APPARATUS FOR ELECTROPLATING LEADS
OF SMALL ELECTRONIC COMPONENTS

Filed Oct. 26, 1962 2 Sheets-Sheet 1

INVENTOR.
PHILIP L. COUTURE

BY James and Franklin

ATTORNEYS

Sept. 27, 1966 P. L. COUTURE 3,275,542

APPARATUS FOR ELECTROPLATING LEADS OF SMALL ELECTRONIC COMPONENTS

Filed Oct. 26, 1962 2 Sheets-Sheet 2

INVENTOR.
PHILIP L. COUTURE

BY James and Franklin

ATTORNEYS

United States Patent Office 3,275,542

Patented Sept. 27, 1966

3,275,542

APPARATUS FOR ELECTROPLATING LEADS OF SMALL ELECTRONIC COMPONENTS

Philip L. Couture, Worcester, Mass., assignor to General Instrument Corporation, Newark, N.J., a corporation of New Jersey Filed Oct. 26, 1962, Ser. No. 233,301

2 Claims. (Cl. 204—222)

This invention relates to the electroplating of leads of small electronic components, and more particularly to the tinning of the slender leads of small glass diodes.

The general object of the invention is to improve apparatus for the specified operation. Heretofore such leads have been tinned by either of two methods. One involves preliminary immersion in a flux bath and then in a molten tin dip or solder bath. This method is relatively slow ad trobulesome. Another method is to electroplate the leads in a tumbling drum having fixed brushes or contacts for engaging the leads as the diodes are tumbled. Some fixed elements must be provided, against which the leads are forced during the tumbling operation, with consequent bending of the slender leads. This is troublesome during subsequent handling and treatment steps for automatic testing, sorting, marking, counting and packaging.

Some objects of the present invention are to overcome the foregoing faults and disadvantages; to provide apparatus characterized by increased production and decreased cost; to obtain a superior tin plate on the leads; and to avoid any bending or distortion of the leads.

To accomplish the foregoing general objects, and other more specific objects which will hereinafter appear, my invention resides in the apparatus elements, and their relation and method of use, as are hereinafter more particularly described in the following specification. The specification is accompanied by a drawing in which.

Figure 1:
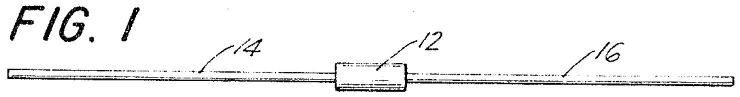
FIG. 1 represents a typical glass diode having leads which are to be tinned.

Referring to the drawing, FIG. 1 shows a small electronic component 12 having slender wire leads 14 and 16 extending in opposite directions from the body 12 of the component. In the particular case here illustrated the component is a semiconductor, and more specifically a germanium junction diode. Silicon diodes are also made in this form. The junction may be housed in a small cylindrical glass envelope. The leads are Dumet leads, extending coaxially from the glass cylinder 12, the latter being sealed around the leads with the aid of a glass bead. The present invention is applicable to other leads, for example, Kovar leads.

In a typical case the envelope 12 may have a length of about 5/16 inch, a diameter of about a tenth inch, and the leads each project for a distance of, say 1¼ inches.

The special alloy employed for the leads is used mainly for the maintenance of a perfect seal between the glass and the metal, but the said alloy is not corrosion resistant nor adapted for easy soldering, and it is therefore customary to coat the lead with a coating of tin or solder, thereby greatly increasing the corrosion resistance, and also facilitating any necessary subsequent soldering operation.

Figure 3:
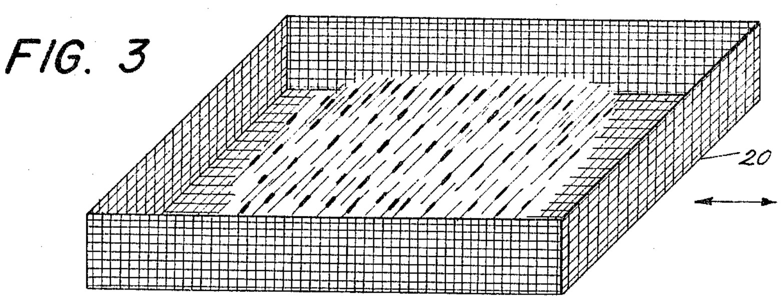
FIG. 3 is a perspective view showing the mesh basket which is loaded with a very large number, say several thousand, of the diodes to be treated.

In accordance with the present invention, a very large number, say several thousand of the diodes, are loaded into a conductive perforate tray, indicated at 20 in FIG. 3. The tray preferably is a relatively flat basket which is open at the top, and which is formed of stainless steel mesh, the mesh being fine enough to contain the diodes, and yet open enough to afford free passage of the electrolyte therethrough. Insofar as the plating is concerned, the positioning of the diodes in the basket may be random. However, it is better to dispose them collaterally, in a direction transverse to the direction of movement later described. Even so, the loading operation is fast and simple.

In the illustrated case the basket has a dimension of about twelve inches by twelve inches by two inches, but the dimensions are not at all critical.

In accordance with conventional practice, the diodes may be preliminarily cleaned in a suitable acid solution, say twenty percent nitric acid, before the plating operation. This may be done with the diodes carried in the same basket that is subsequently used for plating.

In accordance with the present invention, the basket then is immersed in the electrolyte and is given a short rectilinear reciprocation, preferably horizontally. This is sufficient to agitate the diodes so that the leads make electrical contact with one another and with the basket, and it also serves to stir the electrolyte.

The reason it is preferred to reciprocate the diodes in a direction transverse to the diodes is to avoid the possibility of lengthwise movement such that some of the leads may pass through the mesh of the basket. A very fine mesh would prevent this, but is undesirable because the basket receives some coating of deposited metal, and the interstices of the mesh would soon fill. With a more open mesh the basket may be used for a considerable time before having to be deflated. With the transverse motion here employed there is no tendency for the leads to pass through the mesh.

Figure 2:
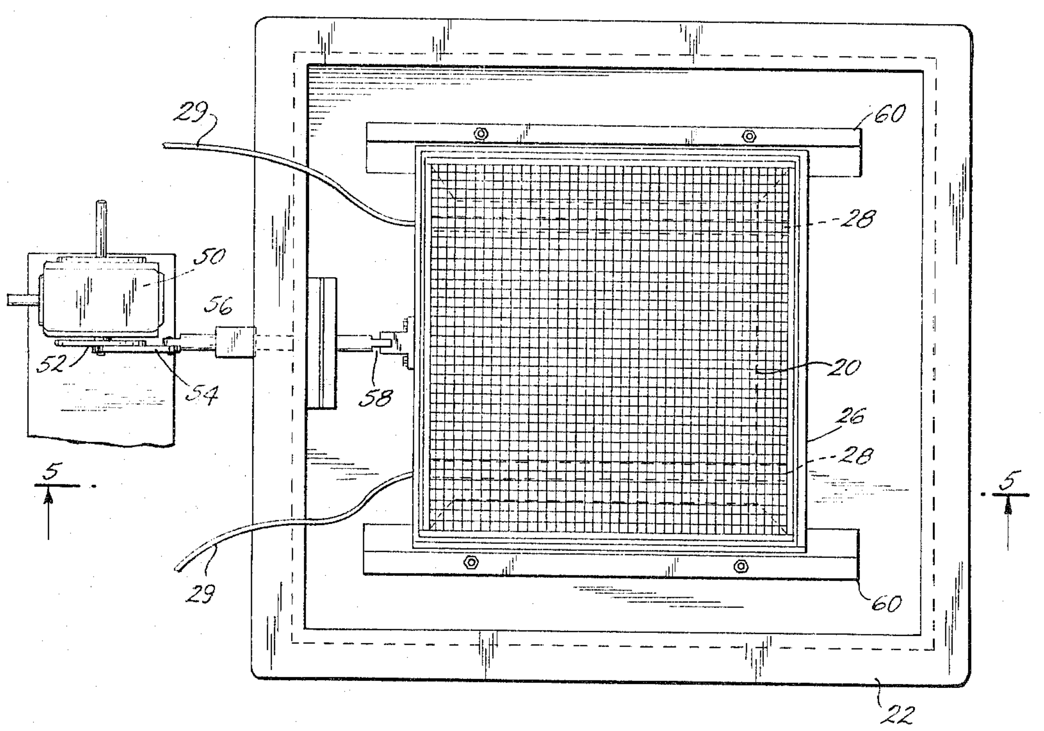
FIG. 2 is a plan view of the plating tank and basket, without the top frame.
Figures 4, 5:
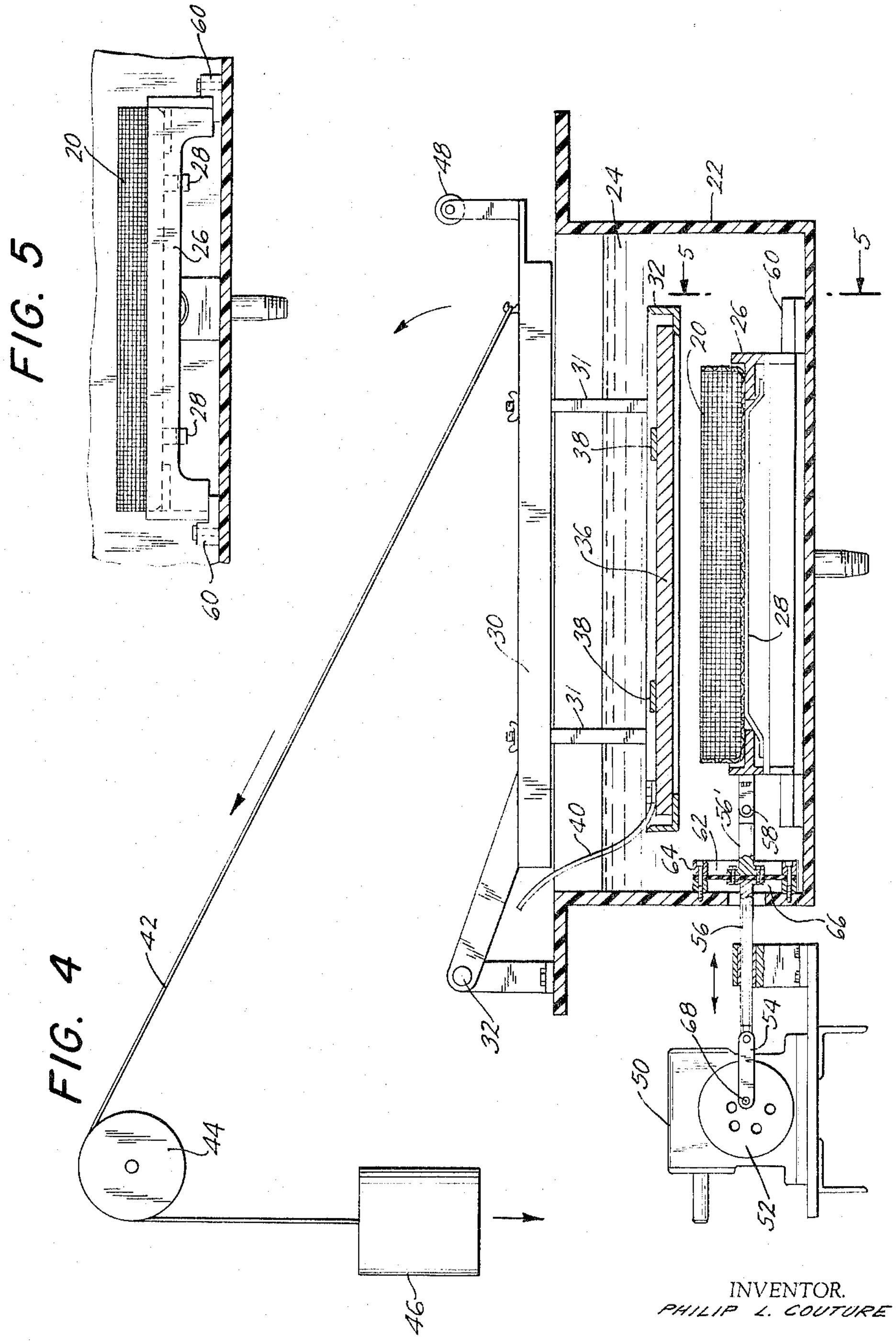
FIG. 4 is a vertical section which schematically illustrates one form of apparatus for practicing the invention.
FIG. 5 is a fragmentary section taken in the plane of the line 5—5 of FIG. 4.

A preferred form of apparatus is schematically illustrated in FIGS. 2, 4 and 5 of the drawing. The apparatus comprises a tank 22 containing the electrolyte 24. The tank has a horizontally reciprocable carrier 26 which receives the basket 20. The carrier 26 may be and preferably is made of an insulation material, say Plexiglas, but it includes at least one, and preferably a number of conductive strips 28 on which the basket rests, and which establish electrical contact therewith. For this purpose flexible conductors 29 (FIG. 2) lead to the strips 28 of the carrier.

The tank has an open frame or anode carrier 30 (FIG. 4), which in the present case is pivoted at 32. The frame 30 carries an angle iron frame 32 made of stainless steel. This carries the anodes 36, which in the present case are made of tin. Suitable supports or cross straps 38 may be provided to detachably hold the anodes 36. Fabric bags may be placed around the anodes, if desired, to retain sludge. These are not shown in the drawing. A conductor 40 is electrically connected to the anodes.

In the particular case here shown there are five anode bars, each 3 inches wide, ¾ inch thick and 15½ inches long. They are made of pure tin. The plating current may be, say 50 amperes, or 10 amperes to each anode, this current being supplied at a voltage of say 4 to 6 volts. The conductor 40 may conveniently be a harness terminating in five spread conductors, one to each anode. The anode support frame 32 is fixedly suspended from the pivoted carrier 30 by a plurality, say four, posts 31 which are made of an insulation material.

These and other dimensions given herein are given solely by way of illustration, and not in limitation of the invention.

The carrier 30 preferably is counterbalanced by suitable means, which in the present case comprises a pull cord 42 passing over a pulley 44, and carrying a counterweight 46. A handle 48 is provided to facilitate raising and lowering of the carrier. When the carrier is raised it clears the tank for ready removal and replacement of the basket 20. It will be understood that a number of baskets may be provided, so that one may be filled, and another may be emptied, while still another is immersed in the tank for the electroplating operation.

The carriage 26 and basket 20 are reciprocated by suitable means. In the present case there is an electric motor 50 with built-in reduction gearing, driving a crank 52 having a connecting rod 54 connected to a horizontally reciprocable rod 56. This may pass through a sealed bushing to prevent leakage of the electrolyte, and is connected to the carrier 26, as indicated at 58. The carrier is slidably supported on suitable guides or ways, indicated at 60, which are preferably made of a plastics material in this case Plexiglas, which withstands corrosion and is not coated with metal or other deposit.

The seal here employed for the drive rod 56 is based on the use of a flexible diaphragm 62, the outer periphery of which is securely clamped between clamp rings at 64, and the center of which receives abutting flanges of rods 56 and 56′ at 66. In the particular case here shown the diaphragm 62 is made of natural rubber having a thickness of ⅛ inch and a diameter of 5 inches. I have also used rubber in tubular form, and in bellows form. Other seals and materials also may be suitable.

The stroke of drive rod 56 may be varied by appropriately changing the location of the crank pin 68 on the crank wheel 52. This may be done in different ways, most simply by the provision of a number of different threaded holes in which the crank pin 68 may be secured, these holes being at different radii. In the present case a stroke up to one inch (meaning ½ inch radius) may be provided, but in practice excellent results have been obtained with a stroke of only ⅜ inch. This motion is adequate to insure contact of the diode leads with one another and with the basket, and also to thoroughly agitate the electrolyte.

The speed of reciprocation is not critical, and in the particular apparatus shown may be adjusted in a range of from 120 to 180 crank revolutions per minute.

It is believed that the construction and operation and method of use of my improved apparatus for tinning the leads of small diodes (or other components), as well as the advantages thereof, will be apparent from the foregoing detailed description.

It has been found that a simple linear reciprocation affords adequate agitation for successful electroplating, and that it does not bend or deform the leads. The loading and unloading of the relatively flat open-top basket is so easy that production is increased and cost is reduced. It is further found that the tin plate applied to the leads is superior in quality and character.

It will be understood that while I have shown and described my invention in a preferred form, changes may be made in the structure and procedure described, without departing from the scope of the invention as sought to be defined in the following claims.

I claim:

1. Apparatus for electroplating the leads of small electronic components, said apparatus comprising a tank for an electrolyte, a reciprocable carrier in said tank, stationary ways for slidably supporting and guiding said carrier for horizontal reciprocation, a relatively flat open-topped conductive basket made of metal mesh detachably received by said carrier and dimensioned to receive a very large number of said components, said ways and said carrier being made of a smooth corrosion-resistant plastics material and said carrier having one or more conductive strips engaging the basket for electrical contact, a pivoted anode carrier over said tank, an anode carried by said carrier and immersed in the electrolyte over the basket, counterbalance means to facilitate raising or lowering of the carrier to remove the anode and to expose the basket for ready removal and replacement, current supply leads extending to said anode and to the conductive strips of the carrier for electrical connection through the basket to the components therein, and motive means to reciprocate the carrier and basket.

2. Apparatus for electroplating the leads of small electronic components, said apparatus comprising a tank for an electrolyte, a reciprocable carrier in said tank, stationary ways for slidably supporting and guiding said carrier for horizontal reciprocation, a relatively flat open-topped conductive basket made of stainless steel mesh detachably received by said carrier and dimensioned to receive a vary large number of said components, said ways and said carrier being made of a smooth corrosion-resistant plastics material and said carrier having one or more conductive strips engaging the basket for electrical contact, a pivoted anode carrier over said tank, an anode carried by said carrier and immersed in the electrolyte over the basket, counterbalance means to facilitate raising or lowering of the carrier to remove the anode and to expose the basket for ready removal and replacement, flexible current supply leads extending to said anode and to the conductive strips of the carrier for electrical connection through the basket to the components therein, a motor outside the tank driving a crank, linkage between said crank and said carrier to reciprocate the carrier and basket, said linkage passing operatively through a side wall of the tank, said side wall having means to seal it against the escape of electrolyte, said sealing means being a flexible diaphragm of sheet rubber having its outer edge secured to the tank wall and its middle secured to the linkage for movement therewith.

References Cited by the Examiner

UNITED STATES PATENTS

| | | | |
|---|---|---|---|
| 574,038 | 12/1896 | Marks | 204—297 |
| 1,873,826 | 8/1932 | Devecis | 204—297 |
| 1,916,492 | 7/1933 | Schuricht | 204—297 |
| 2,766,194 | 9/1956 | Certa | 204—297 |
| 2,841,547 | 7/1958 | Kotz et al. | 204—285 |
| 3,000,806 | 9/1961 | Marotta et al. | 204—285 |

FOREIGN PATENTS

| | | |
|---|---|---|
| 315,481 | 7/1929 | Great Britain. |

JOHN H. MACK, *Primary Examiner.*

R. L. GOOCH, T. TUFARIELLO, *Assistant Examiners.*